United States Patent [19]
Yeh et al.

[11] Patent Number: 6,064,107
[45] Date of Patent: *May 16, 2000

[54] GATE STRUCTURE OF A SEMICONDUCTOR DEVICE HAVING AN AIR GAP

[75] Inventors: Wen-Kuan Yeh, Chupi; Tony Lin, Kaohsiung Hsien; Heng-Sheng Huang, Taipei, all of Taiwan

[73] Assignee: United Microelectronics Corp., Hsin-Chu, Taiwan

[ * ] Notice: This patent issued on a continued prosecution application filed under 37 CFR 1.53(d), and is subject to the twenty year patent term provisions of 35 U.S.C. 154(a)(2).

[21] Appl. No.: 09/056,276

[22] Filed: Apr. 7, 1998

[30] Foreign Application Priority Data

Feb. 10, 1998 [TW] Taiwan .................................. 87101752

[51] Int. Cl.[7] ...................................................... H01L 29/00
[52] U.S. Cl. ............................ 257/522; 257/412; 257/413
[58] Field of Search ..................................... 257/408, 410, 257/412, 413, 522; 438/421

[56] References Cited

U.S. PATENT DOCUMENTS

| | | | |
|---|---|---|---|
| 4,186,408 | 1/1980 | Esch et al. | 257/288 |
| 4,638,347 | 1/1987 | Iyer | 257/408 |
| 5,668,021 | 9/1997 | Subramanian et al. | 438/282 |
| 5,736,446 | 4/1998 | Wu | 438/305 |
| 5,770,507 | 6/1998 | Chen et al. | 438/305 |
| 5,786,256 | 7/1998 | Gardner et al. | 438/305 |
| 5,891,783 | 4/1999 | Lin et al. | 438/302 |
| 6,015,746 | 1/2000 | Yeh et al. | 438/421 |

*Primary Examiner*—J. Carroll
*Attorney, Agent, or Firm*—Thomas, Kayden, Horstemeyer & Risley

[57] ABSTRACT

A semiconductor device comprises a semiconductor substrate, a source/drain region formed in the substrate, a gate oxide layer on the substrate between the source/drain region, a conductive layer on the gate oxide layer, a spacer around a side wall of the gate, and an air gap between the gate and the spacer. The spacer is not directly connected with the gate. The air gap is formed between the gate and the spacer.

10 Claims, 4 Drawing Sheets

GATE STRUCTURE OF A SEMICONDUCTOR DEVICE HAVING AN AIR GAP

CROSS-REFERENCE TO RELATED APPLICATION

This application claims priority benefit of Taiwan application Serial no. 87101752, filed Feb. 10, 1998, the full disclosure of which is incorporated herein by reference.

BACKGROUND OF THE INVENTION

1. Field of the Invention

The invention relates to a method of fabricating a semiconductor device, and more particularly to a method of fabricating a metal-oxide-semiconductor (MOS) transistor.

2. Description of the Related Art

The basic structure of an MOS transistor comprises a gate, a source, and a drain. The gate further comprises a conductive layer and an oxide layer. Normally, the oxide layer includes silicon oxide ($Si_2O$). The source/drain is formed in the substrate in each side of the gate. Since the adhesion between the poly-silicon and the oxide is very strong, poly-silicon is used to form the conductive layer. However, to enhance the speed of date access, a well conductive layer is required. Therefore, a well conductive tungsten silicide layer is further formed on the poly-silicon layer. In addition, a well conductive source/drain is required too. As the devices become smaller and smaller, during the formation of conductive layer, a misalignment is easily to happen. Moreover, in the conventional method, forming a conductive layer on the gate and on the source/drain has to be performed separately.

To solve the above problems, in the conventional method, a process of forming a self-aligned silicide is used to form a titanium silicide ($TiSi_2$) on the gate and the source/drain simultaneously. However, as the devices becomes smaller, it is more difficult to perform the self-aligned silicide process.

In the process of fabricating an MOS transistor, a spacer is formed on the side wall of the gate. A parasitic capacitance is inevitably produced.

FIG. 1A to FIG. 1B show a conventional method of fabricating an MOS transistor. In FIG. 1A, on the <111> plane of a p-type semiconductor substrate 10, an active region is defined. The active region is isolated by a device isolation structure 12, for example, a shallow trench isolation (STI).

In FIG. 1B, a gate oxide layer 14, for example, a silicon oxide layer having a thickness of about 100 Å to 250 Å is formed, for example, by thermal oxidation. On the gate oxide layer 14, a poly-silicon layer 16 having a thickness of about 2000 Å to 3000 Å is formed, for example by low pressure chemical vapor deposition (LPCVD). Using thermal diffusion or ion implantation, phosphorus ions or arsenic ions with a high concentration is doped into the poly-silicon layer 16 reduce the resistivity. While doping the poly-silicon layer 16, oxygen and phosphorus are reacted with poly-silicon to form a very thin (PSG) phosphorus silicate glass layer. To improve the adhesion between the doped poly-silicon layer 16 and the subsequent formed silicide layer, a solution containing hydrogen fluoride (HF) are used to remove the PSG layer. A photo-resist layer 20 is formed and patterned on the poly-silicon layer 16.

In FIG. 1C, using the photo-resist layer 20 as a mask, the poly-silicon layer 16 and the gate oxide layer 14 is etched to form a gate. Using sulfuric acid solution, the photoresist layer 20 is remove.

In FIG. 1D, using the doped poly-silicon layer 16 as a mask, the substrate 10 is lightly doped, for example, with phosphorus ions with a dosage of about $10^{13}/cm^2$ to form a lightly doped region 18.

In FIG. 1E, a dielectric layer, for example, silicon oxide, silicon nitride, or other similar material is formed on the substrate 10. The dielectric layer is anisotropically etched to form a spacer 24 on a side wall of the gate. Using the gate as a mask, the substrate is heavily doped, for example, with phosphorus ions or arsenic ions with a dosage of about $10^{15}/cm^2$ to form a source/drain 28. Since the spacer is formed by dielectric material, a parasitic capacitance is inevitably produced.

As the integration of devices increases, the resistance of source/drain is gradually increased to a value equivalent to the sheet resistance of channel. In FIG. 1F, a silicide layer, for example, a titanium silicide layer, is formed on the gate 16 and the source/drain 28. A conductive layer, for example, a titanium layer having a thickness of about 200 Å to 1000 Å formed by DC magnetron sputtering, is formed first. Under a proper temperature, the conductive layer is reactive with silicon to form a silicide layer 26 on the gate and a silicide layer on the source/drain 28. The remaining or the unreacted conductive layer is removed by wet etching.

As the size of devices shrinks, the parasitic capacitance becomes more and more obvious. To obtain an ultra-large scaled integration with a high operation speed and a low energy, the parasitic has to be minimized. In addition, the margin of short channel has to be increased to avoid short channel effect and punch through effect. Moreover, it is difficult to fabricate titanium salicide.

SUMMARY OF THE INVENTION

It is therefore an object of the invention to provide a method of fabricating a semiconductor device. The parasitic capacitance is reduced, and the short channel effect and the punch through effect are suppressed. In addition, a salicide process of a larger linewidth is performed for a smaller device.

To achieve these objects and advantages, and in accordance with the purpose of the invention, as embodied and broadly described herein, the invention is directed towards a semiconductor device. A semiconductor comprises a semiconductor substrate, a source/drain region formed in the substrate, a gate oxide layer on the substrate between the source/drain region, a conductive layer on the gate oxide layer, a spacer around a side wall of the gate, and an air gap between the gate and the spacer. The spacer is not directly connected with the gate. The air gap is formed between the gate and the spacer.

It is to be understood that both the foregoing general description and the following detailed description are exemplary and explanatory only and are not restrictive of the invention, as claimed.

DESCRIPTION OF THE PREFERRED EMBODIMENTS

Figure 1A:
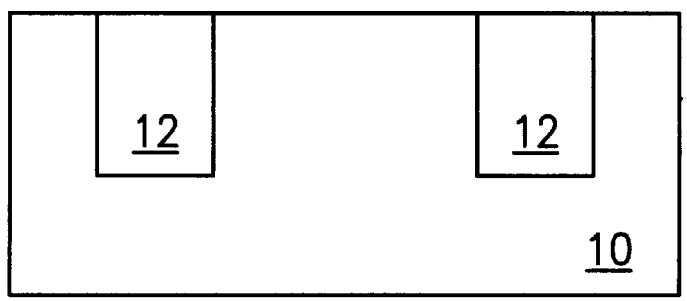
FIGS. 1A to FIG. 1F are cross sectional views of a conventional process for fabricating an MOS transistor.
Figure 1B:
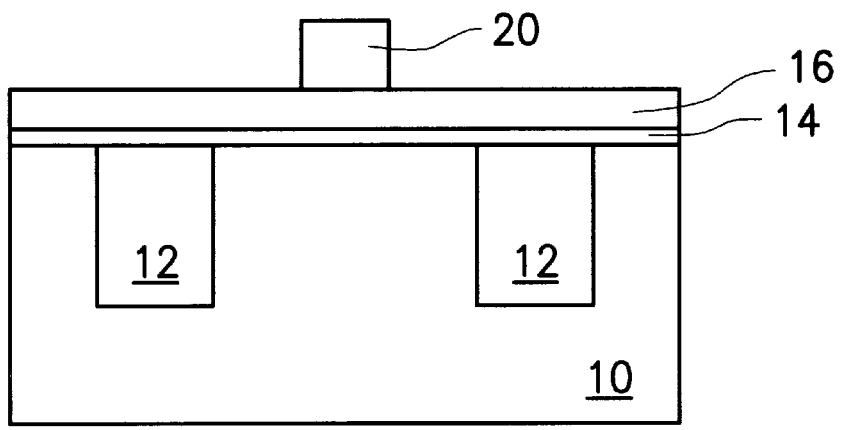
Figure 1C:
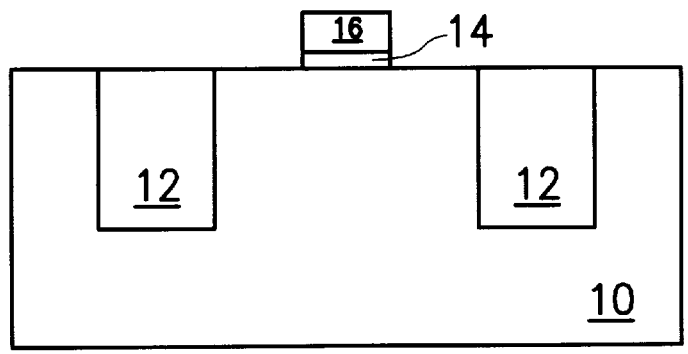
Figure 1D:
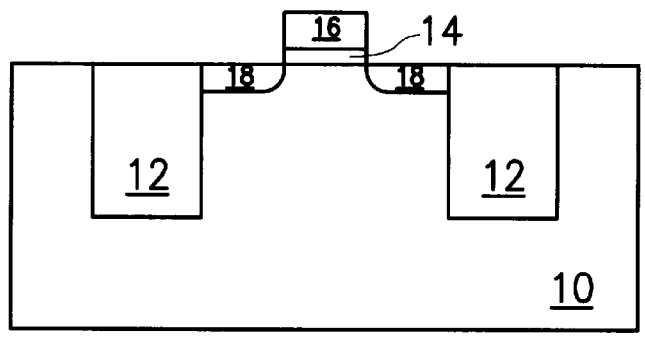
Figure 1E:
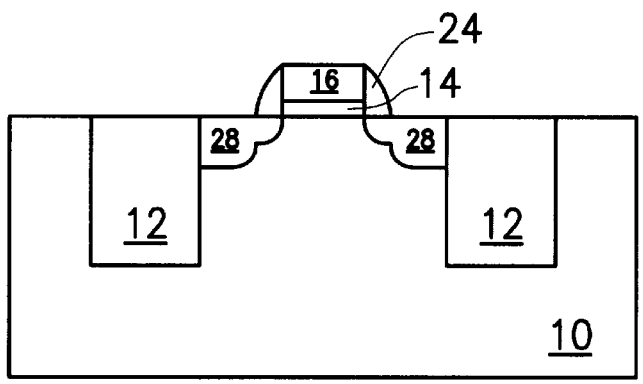
Figure 1F:
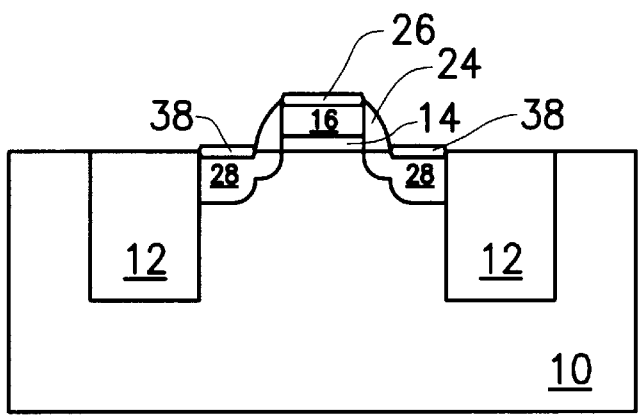
Figure 2A:
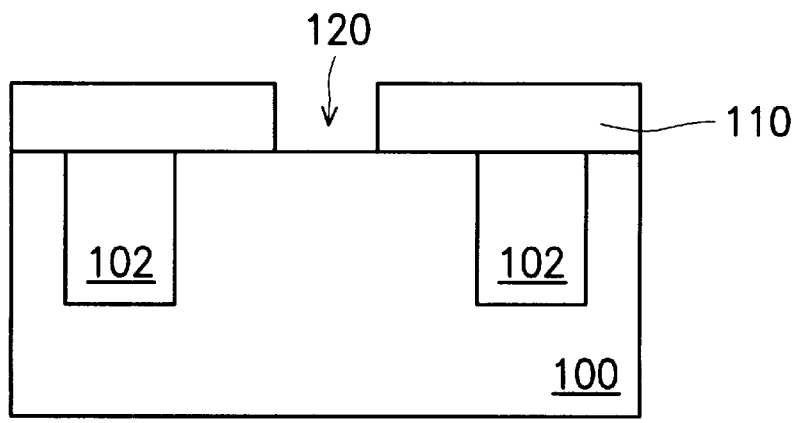
FIGS. 2A to FIG. 2F are cross sectional views of the process for fabricating an MOS transistor in a preferred embodiment according to the invention.

In FIG. 2A, on a semiconductor substrate 100 such as a P-type substrate, a device isolation structure 102, for example, a shallow trench isolation (STI), a field oxide layer (FOX), or other similar structure is form. An oxide layer 110 having a thickness of about 1000 Å to 2000 Å is formed and etched to form an opening 120, so that the substrate 100 is exposed within the opening 102.

Figure 2B:
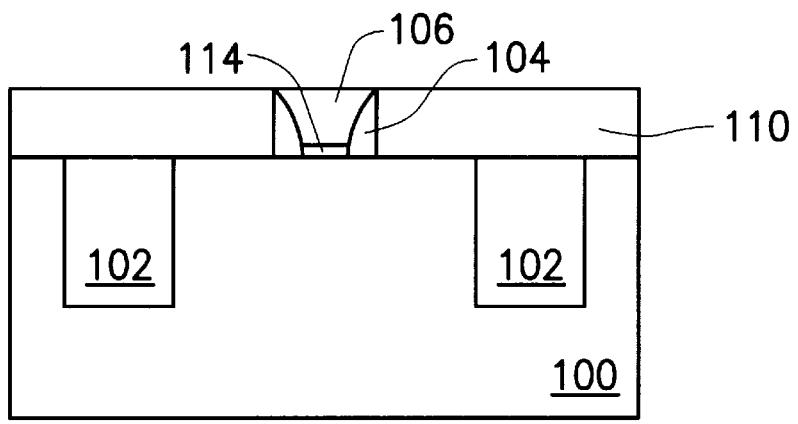
Figure 2C:
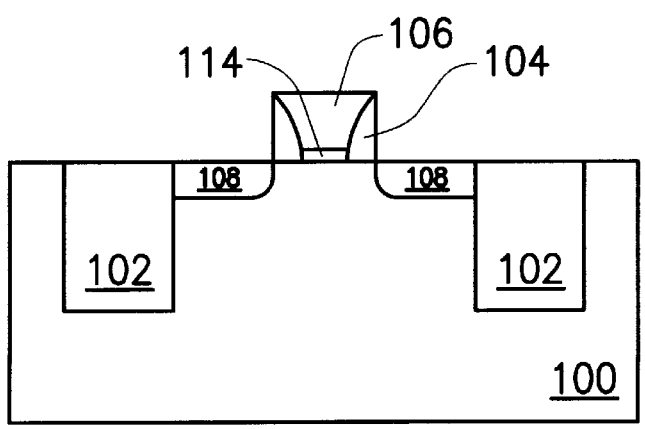

In FIG. 2B, a conformal silicon nitride layer is formed on the oxide layer 110 and the opening 120. The silicon nitride layer is anisotropically etched to form a spacer 104 on a side wall of the opening 120. The opening 120 is filled with a gate structure comprising oxide layer 114 and a conductive layer 106. The gate oxide layer 114 includes, for example, a silicon oxide layer having a thickness of about 100 Å to 250 Å formed by thermal oxidation on the exposed substrate 100. Since the adhesion between oxide and poly-silicon is very good, the conductive layer 106 is formed of, for example, a poly-silicon layer 106 by LPCVD to a thickness of about 2000 Å to 3000 Å. Using thermal diffusion or ion implantation with phosphorus or arsenic ions, the poly-silicon layer is doped to increase conductivity. If phosphorus ions are in use to dope the poly-silicon layer, phosphorus and oxygen are reacted with the poly-silicon to form a PSG layer on the poly-silicon layer. To enhance the adhesion between the poly-silicon layer and a subsequently formed silicide layer, the PSG layer is removed by HF solution. The conductive layer is planarized, for example, by chemical-mechanical polishing (CMP), to expose the surface of the oxide layer 110, so that a conductive layer 106 is formed as shown in the figure. The process of planarization prevents the formation of pittings, and therefore, the junction capacitance is reduced. The resultant structure of the gate is wide on the upper part, and narrow on the lower part. A process of larger linewidth can be used to form a device with a smaller size.

In FIG,. 2C, the oxide layer 110 is removed by wet etching. Using the conductive layer 106 and the silicon nitride spacer 104 as a mask, the substrate 100 is lightly doped with ions, for example, phosphorus ions with a concentration of about $10^{13}/cm^2$, to form a lightly doped region 108.

Figure 2D:
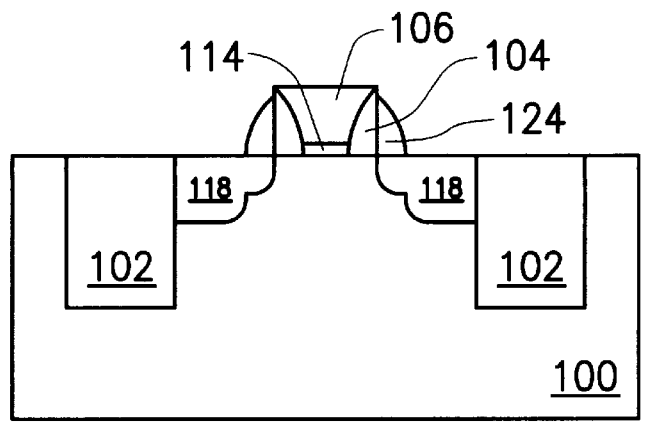

In FIG. 2D, a spacer 124 is formed on a side wall of the silicon nitride spacer 104. The material of the spacer 124 is different from silicon nitride, such as silicon oxide. Using the conductive layer 106, the silicon nitride spacer 104, and the spacer 124 as a mask, the substrate 100 is heavily doped with ions, for example, phosphorus or arsenic ions with a concentration of about $10^{15}/cm^2$, to form a source/drain region 118.

Figure 2E:
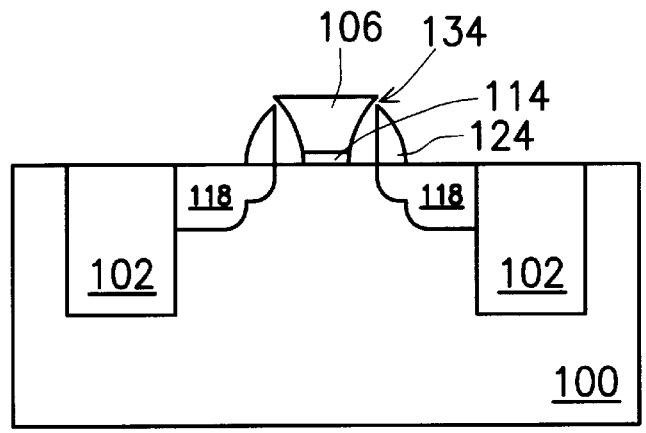
Figure 2F:
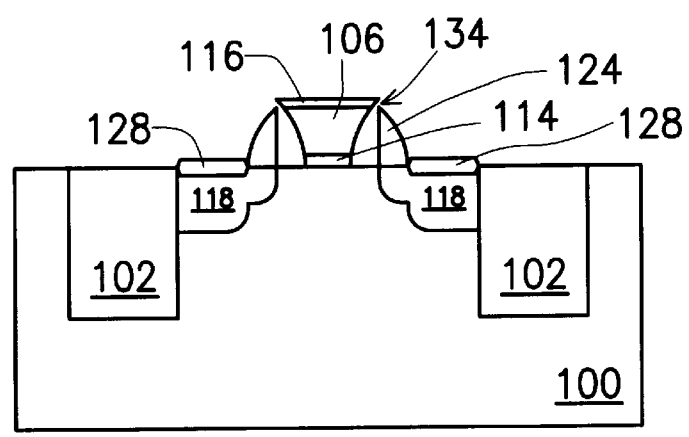

In FIG. 2E, using wet etching with hot phosphorus acid ($H_3PO_4$), the silicon nitride spacer 104 is removed. Therefore, the gate is defined, and an air gap 134 is formed between the gate and the spacer 124. The air gap 134 exposes a portion of the substrate 100. The air gap 134 is covered by the upper part of the conductive layer 106 of the gate. The conductive layer 106 overhangs the air gap. According to the formula of calculating capacitance, that is, $C=\epsilon A/d$, wherein A is the surface area, d is the thickness of dielectric, and $\epsilon$ is the dielectric constant of dielectric, the capacitance is proportional to the dielectric constant of dielectric. For a conventional gate structure, on the side wall of the gate, a spacer with a dielectric constant larger than 1, that is, $\epsilon>1$ is formed. In the invention, a air gap 134 with a dielectric constant $\epsilon=1$ is formed between the gate and the spacer 124, thus, the parasitic capacitance is reduced.

To increase the operation speed, silicide layers 116 and 128 are formed on the gate and the source/drain region 118 to increase the conductivity. A well conductive titanium layer having a thickness of about 200 Å to 1000 Å is formed on the gate and the source/drain region 118, for example, by DC magnetron sputtering. Under a proper temperature range, the titanium layer is reacted with the silicon to form titanium silicide layers 116 and 128 on the gate and the source/drain region 118, respectively. The remaining or unreacted titanium layer is removed by wet etching.

The first characteristic of the invention is that the gate structure is defined after the formation of a spacer. A larger short channel margin is formed, so that the short channel effect and the punch through effect are suppressed.

The second characteristic of the invention is that the topography of the gate is wide on the upper part, and narrow on the lower part. The advantage of the special topography is that a fabrication process of a larger linewidth can be used to fabricate a device of a smaller size. For example, while fabricating a device of a 0.15 μm linewidth, a salicide process of 0.18 μm can be used to obtain the required results. For a device of a 0.18 μm linewidth, a salicide process of 0.25 μm can be used.

The third characteristic of the invention is that a process of planarization is performed to prevent the formation of pittings, so that the junction capacitance is reduced.

The fourth characteristic of the invention is that an air gap is formed between the side wall of the gate and the spacer. The dielectric constant of air is much smaller than the material of the spacer, so that the parasitic capacitance is reduced.

Other embodiment of the invention will appear to those skilled in the art from consideration of the specification and practice of the invention disclosed herein. It is intended that the specification and examples to be considered as exemplary only, with a true scope and spirit of the invention being indicated by the following, claims.

What is claimed is:

1. A gate structure, comprising:

a semiconductor substrate;

an oxide layer located over the substrate;

a conductive layer formed on the oxide layer, wherein an upper portion of the conductive layer is wider than a lower portion of the conductive layer, and the width of the lower portion of the conductive layer is substantially equal to the width of the oxide layer to closely align therewith;

a spacer surrounding a side wall of the conductive layer and the oxide layer, wherein the spacer is not directly connected with the conductive layer and the height of the spacer is lower than the upper portion of the conductive layer; and an air gap located between the conductive layer and the spacer to expose a portion of the substrate, wherein the conductive layer overhangs the air gap.

2. The gate structure according to claim 1, wherein the oxide layer includes a silicon oxide layer having a thickness of about 100 Å to 250 Å.

3. The gate structure according to claim 1, wherein the conductive layer includes a poly-silicon layer.

4. The gate structure according to claim 3, wherein the poly-silicon layer has a thickness of about 2000 Å to 3000 Å.

5. The gate structure according to claim 1, wherein a source/drain region is further comprised in the substrate.

6. The gate structure according to claim 1, wherein the source/drain region is formed by a process of lightly doped drain.

7. A semiconductor device having a gate-side air-gap structure, comprising:

a semiconductor substrate;

a source/drain region formed in the substrate, wherein the source/drain region comprises a source region and a drain region;

a gate oxide layer on the substrate between the source region and the drain region;

a conductive layer formed on the gate oxide layer, wherein an upper portion of the conductive layer is wider than a lower portion of the conductive layer, and the width of the lower portion of the conductive layer is substantially equal to the width of the oxide layer to closely align therewith;

a spacer surrounding a side wall of the conductive layer and the gate oxide layer, wherein the spacer is not directly connected with the conductive layer and the height of the spacer is lower than the upper portion of the conductive layer; and an air gap located between the conductive layer and the spacer to expose a portion of the substrate, wherein the conductive layer overhangs the air gap.

8. The semiconductor device according to claim 7, wherein the gate oxide layer includes a silicon oxide layer having a thickness of about 100 Å to 250 Å.

9. The semiconductor device according to claim 7, wherein the conductive layer includes a poly-silicon layer.

10. The semiconductor device according to claim 9, wherein the poly-silicon layer has a thickness of about 2000 Å to 3000 Å.

* * * * *